US 12,255,398 B2

United States Patent
Masaki et al.

(10) Patent No.: US 12,255,398 B2
(45) Date of Patent: Mar. 18, 2025

(54) RADIO WAVE ABSORBER

(71) Applicant: Mitsubishi Electric Corporation, Tokyo (JP)

(72) Inventors: Motoki Masaki, Tokyo (JP); Fumiaki Baba, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 393 days.

(21) Appl. No.: 17/789,222

(22) PCT Filed: Feb. 27, 2020

(86) PCT No.: PCT/JP2020/008024
§ 371 (c)(1),
(2) Date: Jun. 27, 2022

(87) PCT Pub. No.: WO2021/171479
PCT Pub. Date: Sep. 2, 2021

(65) Prior Publication Data
US 2023/0054631 A1  Feb. 23, 2023

(51) Int. Cl.
*H01Q 17/00* (2006.01)
*H01F 1/34* (2006.01)
*H05K 9/00* (2006.01)

(52) U.S. Cl.
CPC ........... *H01Q 17/004* (2013.01); *H01F 1/344* (2013.01); *H05K 9/0081* (2013.01)

(58) Field of Classification Search
CPC .............................. H01Q 17/004; H01F 1/344
See application file for complete search history.

(56) References Cited

U.S. PATENT DOCUMENTS

| | | | | |
|---|---|---|---|---|
| 8,758,721 B2* | 6/2014 | Hill | ........................... | H01F 1/01 |
| | | | | 252/62.62 |
| 2009/0297432 A1* | 12/2009 | Hill | ....................... | H01F 1/348 |
| | | | | 423/594.2 |
| 2010/0171066 A1* | 7/2010 | Ohkoshi | .................. | H01F 1/344 |
| | | | | 977/773 |
| 2013/0257639 A1* | 10/2013 | Takahashi | .............. | H01Q 17/00 |
| | | | | 148/284 |
| 2015/0084804 A1* | 3/2015 | Takahashi | ............ | H01Q 17/004 |
| | | | | 428/546 |
| 2019/0289759 A1* | 9/2019 | West | ........................ | C08K 3/22 |

(Continued)

FOREIGN PATENT DOCUMENTS

| JP | 7-201548 A | 8/1995 |
|---|---|---|
| JP | 8-115809 A | 5/1996 |
| JP | 9-507828 A | 8/1997 |

(Continued)

OTHER PUBLICATIONS

International Search Report and Written Opinion mailed on May 19, 2020, received for PCT Application PCT/JP2020/008024, filed on Feb. 27, 2020, 10 pages including English Translation.

(Continued)

*Primary Examiner* — Marcus E Windrich
(74) *Attorney, Agent, or Firm* — XSENSUS LLP

(57) ABSTRACT

A radio wave absorber includes hexagonal ferrite particles and a holding material-filled with the hexagonal ferrite particles. The hexagonal ferrite particles include first particles and second particles that are larger than the first particles in particle size.

19 Claims, 2 Drawing Sheets

(56) References Cited

U.S. PATENT DOCUMENTS

2020/0069428 A1* 3/2020 Johnson .................. A61F 2/30

FOREIGN PATENT DOCUMENTS

| | | |
|---|---|---|
| JP | 11-354972 A | 12/1999 |
| JP | 2000-31686 A | 1/2000 |
| JP | 2002-198685 A | 7/2002 |
| JP | 2007-250823 A | 9/2007 |
| JP | 2008-50220 A | 3/2008 |
| JP | 2008-66364 A | 3/2008 |
| JP | 2010-114407 A | 5/2010 |
| JP | 2010-135567 A | 6/2010 |
| JP | 2018-56492 A | 4/2018 |
| JP | 2018-67593 A | 4/2018 |
| JP | 2019-110166 A | 7/2019 |
| WO | 96/15078 A1 | 5/1996 |

OTHER PUBLICATIONS

Shoichi Okamoto, "Magnetism and Material", 1988, 9 pages including English Abstract.
Objection mailed on May 18, 2021, received for JP Application 2021-700470, 57 pages including English Translation.
Decision on Opposition mailed on Aug. 16, 2021, received for JP Application 2020-542915, 44 pages including English Translation.
Office Action dated Oct. 14, 2024 issued in corresponding DE patent application No. 112020006825.0 (and English translation).
Office Action dated Nov. 14, 2024 issued in corresponding CN patent application No. 202080096961.0 (and English translation).

* cited by examiner

RADIO WAVE ABSORBER

CROSS-REFERENCE TO RELATED APPLICATION

The present application is based on PCT filing PCT/JP2020/008024, filed Feb. 27, 2020, the entire contents of which are incorporated herein by reference.

TECHNICAL FIELD

The present disclosure relates to a radio wave absorber used to remove unwanted radio waves, such as electromagnetic noise.

BACKGROUND ART

Patent Literature 1 discloses a radio wave absorber including a magnetoplumbite hexagonal ferrite. The magnetoplumbite hexagonal ferrite disclosed in Patent Literature 1 absorbs and removes radio waves in a specific frequency band. This characteristic is obtained by substituting some of iron atoms of a hexagonal ferrite with other transition metal atoms.

CITATION LIST

Patent Literature

Patent Literature 1: Japanese Unexamined Patent Application Publication No. 11-354972

SUMMARY OF INVENTION

Technical Problem

However, the radio wave absorber disclosed in Patent Literature 1 mainly absorbs radio waves in a microwave frequency band below 20 GHz and possibly does not have a sufficient radio wave absorption performance in a frequency band of 20 GHz or higher.

The present disclosure has been made to solve the above problem and is directed to a radio wave absorber having an effective radio wave absorption performance in a frequency band of 20 GHz or higher.

Solution to Problem

A radio wave absorber includes hexagonal ferrite particles and a holding material filled with the hexagonal ferrite particles. The hexagonal ferrite particles include first particles and second particles that are larger than the first particles in particle size.

Advantageous Effects of Invention

A radio wave absorber that has this configuration is provided that has an effective radio wave absorption performance in a frequency band of 20 GHz or higher.

DESCRIPTION OF EMBODIMENTS

Embodiment 1

Figure 1:
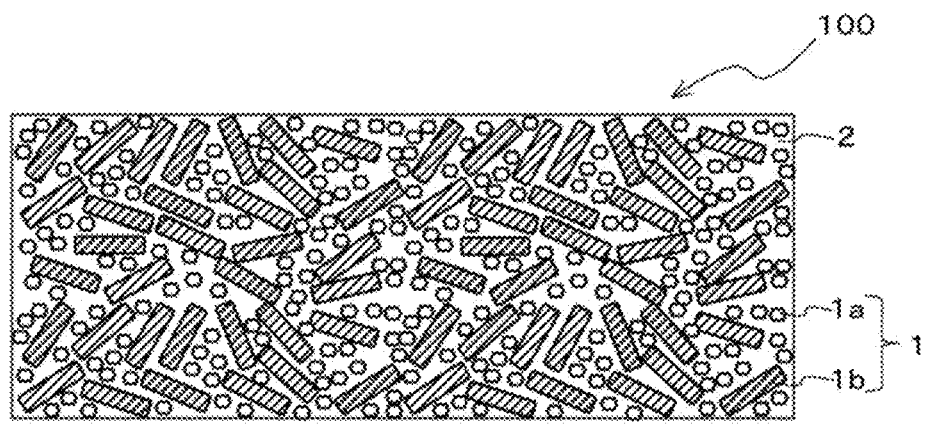
FIG. 1 is an example schematic cross-sectional view of a radio wave absorber according to Embodiment 1.

The properties and structure of a radio wave absorber 100 according to Embodiment 1 will be described with reference to FIG. 1. FIG. 1 is an example schematic cross-sectional view of the radio wave absorber 100 according to Embodiment 1.

The radio wave absorber 100 is a ferrite material containing a magnetic material that absorbs radio waves incident on the radio wave absorber 100. The radio wave absorber 100 absorbs radio waves by converting the wave energy of the radio waves into heat energy using the magnetic loss properties of the magnetic material. In the radio wave absorber 100, the frequency band in which the magnetic loss of the magnetic material reaches the maximum possible is the frequency band of radio waves that are absorbed by the radio wave absorber 100.

The thickness of the radio wave absorber 100 is preferably in the range of 1 mm or more and 5 mm or less. With the thickness of the radio wave absorber 100 in the range of 1 mm or more and 5 mm or less, the radio wave absorber 100 has both better handleability and higher radio wave absorption performance. The size and shape of the radio wave absorber 100 are not limited to those illustrated in FIG. 1 and are changed depending on, for example, the intended use of the radio wave absorber 100.

As illustrated in FIG. 1, the radio wave absorber 100 has hexagonal ferrite particles 1 and a holding material 2 filled with the hexagonal ferrite particles 1. In the radio wave absorber 100, the hexagonal ferrite particles 1 are dispersed in the holding material 2.

The hexagonal ferrite particles 1 are each composed of a magnetic material having a hexagonal crystal structure having constituent elements arranged in a hexagonal column shape. The hexagonal ferrite particles 1 have radio wave absorption performance in the direction perpendicular to the hexagonal face of the crystal structure. For example, magnetoplumbite hexagonal ferrites, such as $BaFe_{12}O_{19}$ and $SrFe_{12}O_{19}$, are used as the hexagonal ferrite particles 1. Magnetoplumbite hexagonal ferrites are also referred to as M-type hexagonal ferrites.

The hexagonal ferrite particles 1 may be hexagonal ferrite particles 1 having a hexagonal crystal structure different from those of M-type hexagonal ferrites. The hexagonal ferrite particles 1 may include, for example, W-type hexagonal ferrites, Z-type hexagonal ferrites, or Y-type hexagonal ferrites. Examples of W-type hexagonal ferrites include $BaFe_{18}O_{27}$ and $SrFe_{18}O_{27}$. Examples of Z-type hexagonal ferrites include $Ba_3Co_2Fe_{24}O_{41}$ and $Sr_3Co_2Fe_{24}O_{41}$. Examples of Y-type hexagonal ferrites include $BaZnFe_{12}O_{22}$. The hexagonal ferrite particles 1 may be a combination of two or more types of hexagonal ferrites. The hexagonal ferrite particles 1 may include a hexagonal ferrite produced by substituting some of transition metal elements, such as Ba, Sr, and Fe, that form the hexagonal ferrites described above with other transition metal elements, such as Ti, Sn, Zr, Cu, and Ni.

A radio wave absorber 100 in the related art includes, as a magnetic material, spinel ferrite particles having a cubic crystal structure. Spinel ferrite particles have radio wave absorption performance in a low frequency band below 1 GHz, which is called the megahertz (MHz) band. However, the magnetic loss of spinel ferrite particles in a high frequency band of 1 GHz or higher is smaller than the magnetic loss in a low frequency band below 1 GHz. Spinel ferrite particles thus have a poor radio wave absorption performance in a high frequency band of 1 GHz or higher. Therefore, the radio wave absorber 100 in the related art fails to satisfy property as the radio wave absorber 100 used in a high frequency band of 1 GHz or higher, which is called the gigahertz (GHz) band.

The hexagonal ferrite particles 1 have larger magnetocrystalline anisotropy than spinel ferrite particles and thus satisfy property as a radio wave absorbing material in a high frequency band of 20 GHz or higher. As the hexagonal ferrite particles 1, M-type hexagonal ferrites, which have large magnetocrystalline anisotropy and may have radio wave absorption performance in a frequency band of 20 GHz or higher, are preferably used among the hexagonal ferrites described above.

The amount of the hexagonal ferrite particles 1 included in the radio wave absorber 100 is preferably 70 weight percent or more and 95 weight percent or less, more preferably 75 weight percent or more and 90 weight percent or less. When the amount of the hexagonal ferrite particles 1 is 75 weight percent or more and 90 weight percent or less, it is easy to mix and disperse the hexagonal ferrite particles 1 in the holding material 2, and it is thus possible to improve workability and formability in the production of the radio wave absorber 100. When the amount of the hexagonal ferrite particles 1 is 75 weight percent or more and 90 weight percent or less, the radio wave absorber 100 is configured to sufficiently maintain the radio wave absorption performance needed to remove radio waves. If the amount of the hexagonal ferrite particles 1 is less than 70 weight percent, the radio wave absorber 100 may not maintain the radio wave absorption performance needed to remove radio waves. If the amount of the hexagonal ferrite particles 1 is more than 95 weight percent, it may be difficult to mix and disperse the hexagonal ferrite particles 1 in the holding material 2, and thus poor workability or poor formability may be caused.

The holding material 2 is a substrate filled with the hexagonal ferrite particles 1. The holding material 2 is not limited and may include, for example, an organic polymer resin, such as a thermoplastic resin. The thermoplastic resin is not limited and is, for example, a polymer or copolymer of one or more monomers selected from the group consisting of ethylene, propylene, butadiene, isoprene, styrene, methacrylic acid, acrylic acid, methacrylic acid ester, acrylic acid ester, vinyl chloride, ethylene tetrafluoride, acrylonitrile, maleic anhydride, and vinyl acetate. Examples of the thermoplastic resin include polyphenylene ether resin, chlorinated polyethylene resin, silicone resin, polyamide resin, polyimide resin, polycarbonate resin, polyester resin, polyacetal resin, polyphenylene sulfide resin, polyethylene glycol resin, polyetherimide resin, polyketone resin, polyether ether ketone resin, polyethersulfone resin, and polyarylate resin.

An additive, such as a flame retardant, may be added to the radio wave absorber 100. Examples of the flame retardant include, but are not limited to, organic flame retardants of halogenated compounds, such as chlorinated paraffin and pentabromodiphenyl ether. The amount of the flame retardant added is controlled such that the flame retardant inhibits the radio wave absorption performance of the radio wave absorber 100.

Next, the particle size of the hexagonal ferrite particles 1 will be described.

As described above, M-type hexagonal ferrites are preferably used as the hexagonal ferrite particles 1. By using M-type hexagonal ferrites as the hexagonal ferrite particles 1, the radio wave absorber 100 is theoretically formed to have radio wave absorption performance in a high frequency band of 20 GHz or higher. In the case of using, for example, $BaFe_{12}O_{19}$ as M-type hexagonal ferrites, the radio wave absorber 100 is theoretically formed to have radio wave absorption performance in the 48-GHz band.

The magnetic loss properties of the hexagonal ferrite particles 1 change depending on the particle size of the hexagonal ferrite particles 1, and the frequency band in which the magnetic loss of the hexagonal ferrite particles 1 reaches the maximum possible changes depending on the particle size of the hexagonal ferrite particles 1. Since the radio wave absorber 100 uses the radio wave absorption performance associated with the magnetic loss properties of the hexagonal ferrite particles 1, first particles 1*a* and second particles 1*b* are required to have the maximum possible magnetic loss in a frequency band in which the radio wave absorption performance is needed. The radio wave absorber 100 having radio wave absorption performance in a desired frequency band is thus obtained by controlling the particle size of the hexagonal ferrite particles 1.

As illustrated in FIG. 1, the hexagonal ferrite particles 1 include the first particles 1*a* and the second particles 1*b*, which are larger than the first particles 1*a* in particle size. The first particles 1*a* are formed as, for example, fine particles having a particle size of less than 1 μm. The second particles 1*b* are formed as, for example, coarse particles having a particle size of 5 μm or more. In the following description, the particle size of the first particles 1*a* is referred to as a "first particle size", and the particle size of the second particles 1*b* is referred to as a "second particle size".

The first particle size of the first particles 1*a* and the second particle size of the second particles 1*b* in the radio wave absorber 100 are determined by, for example, particle size distribution measurement using a laser diffraction scattering method. The laser diffraction scattering method is a method for determining the particle size distribution using the Fraunhofer diffraction theory or the Mie scattering theory by measuring the angular patterns of the diffracted light intensity and the scattering light intensity, which change depending on the particle size. The laser diffraction scattering method uses a sample of the hexagonal ferrite particles 1 produced by ashing the radio wave absorber 100. The sample of the hexagonal ferrite particles 1 used in the measurement is produced by heating the radio wave absorber 100 into ash at a temperature of 500 degrees C. to 800 degrees C. for 5 to 10 hours in an air atmosphere using an electric furnace.

The radio wave absorber 100 having radio wave absorption performance in different frequency bands in a frequency band of 20 GHz or higher is obtained by using the hexagonal ferrite particles 1 having the first particles 1*a* and the second particles 1*b*, which are larger than the first particles 1*a* in particle size. When the particle size of the first particles 1*a* is smaller than the particle size of the second particles 1*b*, the aspect ratio of the first particles 1*a* is smaller than the aspect ratio of the second particles 1*b*. When the aspect ratio of the first particles 1*a* is smaller than the aspect ratio of the second particles 1b, the intensity of the demagnetizing field in the first particles 1a is smaller than the intensity of the demagnetizing field in the second particles 1b. The resonant frequency of the first particles 1a is therefore larger than the resonant frequency of the second particles 1b in the radio wave absorber 100, and the frequency band in which the first particles 1a have radio wave absorption performance is larger than the frequency band in which the second particles 1b have radio wave absorption performance.

The radio wave absorber 100 having radio wave absorption performance in the 79-GHz band is produced by, for example, adjusting the first particle size of the first particles 1a to 1 µm or less. The radio wave absorber 100 having radio wave absorption performance in the 28-GHz band is produced by adjusting the second particle size of the second particles 1b to 5 µm or more.

The first particles 1a are formed such that the lower limit of the first particle size is 0.05 µm or more. This is because, when the first particle size of the first particles 1a is less than 0.05 µm, the first particles 1a tightly aggregate, and it is thus difficult to uniformly mix and disperse the first particles 1a in the holding material 2. The second particles 1b are formed such that the upper limit of the second particle size is 100 µm or less. This is because, when the second particle size of the second particles 1b exceeds 100 µm, it is difficult to adjust the thickness of the radio wave absorber 100 such that the radio wave absorber 100 has a sheet shape.

In the field of electronic devices, electronic devices operate at higher frequencies and have more components at higher densities as electronic devices become more compact and have higher performance. Thus, a measure to reduce or eliminate electromagnetic noise causing malfunction of electronic devices is an important issue in the field of electronic devices. In recent years, radio waves in the 28-GHz band have been used in 5G high-speed communication systems, and radio waves in the 79-GHz band have been used in millimeter-wave radars for collision avoidance mounted in vehicles. There is thus a particular need of a measure to reduce or eliminate electromagnetic noise specific to the 28-GHz band and the 79-GHz band in the field of electronic devices.

A measure to reduce or eliminate electromagnetic noise in the 28-GHz band and the 79-GHz band generated from electronic devices is implemented by using, for example, the radio wave absorber 100 in which the first particles 1a each have a first particle size of 1 µm or less and the second particles 1b each have a second particle size of 5 µm or more. Therefore, when the radio wave absorber 100 having the first particles 1a and the second particles 1b, which are larger than the first particles 1a in particle size, is disposed in electronic devices, the radio wave absorber 100 absorbs unwanted radio waves generated from electronic devices.

Next, the crystal orientation of the hexagonal ferrite particles 1 will be described. In the following description, the hexagonal plane in the crystal structure of the hexagonal ferrite particles 1 is referred to as a "c-plane". The degree of convergence of the orientation of the normal to the c-plane of the hexagonal ferrite particles 1 in the radio wave absorber 100 is referred to as a "degree of c-plane orientation" of the hexagonal ferrite particles 1 in the radio wave absorber 100.

The hexagonal ferrite particles 1 tend to grow their crystal in the direction parallel to the c-plane. Since the first particles 1a are smaller than the second particles 1b in aspect ratio, the first particles 1a are mixed and dispersed in the holding material 2 with the c-planes of the first particles 1a randomly oriented, compared with the second particles 1b. There is thus no anisotropy in the radio wave absorption performance of the first particles 1a in the radio wave absorber 100, and the first particles 1a absorb radio waves arriving from various directions.

The second particles 1b are more easily oriented in the direction parallel to the c-plane and more easily formed into a plate shape than the first particles 1a during dispersion, formation, or other processes in the production of the radio wave absorber 100.

The second particles 1b, which are plate-shaped crystal particles, are easily mixed and dispersed in the holding material 2 with the c-plane of the second particles 1b oriented in a particular direction, compared with the c-plane of the first particles 1a. The degree of c-plane orientation of the second particles 1b is larger than the degree of c-plane orientation of the first particles 1a. Therefore, anisotropy tends to be observed in the radio wave absorption performance of the second particles 1b in the radio wave absorber 100, and the second particles 1b may thus absorb only radio waves arriving from a particular direction and may not absorb radio waves arriving from the other directions.

However, when the radio wave absorber 100 contains the first particles 1a and the second particles 1b, the degree of c-plane orientation of the hexagonal ferrite particles 1 decreases and the anisotropy of the hexagonal ferrite particles 1 decreases as the amount of the first particles 1a increases above the amount of the second particles 1b. As the amount of the second particles 1b increases above the amount of the first particles 1a in the radio wave absorber 100, the degree of c-plane orientation of the hexagonal ferrite particles 1 increases, and the anisotropy of the hexagonal ferrite particles 1 increases. Therefore, the anisotropy of the radio wave absorption performance of the radio wave absorber 100 is controlled by forming the radio wave absorber 100 using the hexagonal ferrite particles 1 containing the first particles 1a and the second particles 1b.

The degree of c-plane orientation of the hexagonal ferrite particles 1 in the radio wave absorber 100 is quantitively evaluated by a Lotgering method (Lotgering factor) using X-ray diffraction. The Lotgering method will be described below.

The degree f of c-plane orientation of the hexagonal ferrite particles 1 in the Lotgering method is calculated from Formula (1), where P0 is the reference peak intensity obtained from a non-oriented sample of the hexagonal ferrite particles 1, and P is the peak intensity obtained from an oriented sample of the hexagonal ferrite particles 1.

$$f=(P-P0)/(1-P0) \tag{1}$$

The reference peak intensity P0 is calculated by using a measured value of the X-ray diffraction intensity I0 obtained from the non-oriented sample of the hexagonal ferrite particles 1. As shown in Formula (2), the reference peak intensity P0 is represented by the ratio of the sum of diffraction intensities I0(xyz) obtained from the crystal orientation planes (xyz) of non-oriented samples of the hexagonal ferrite particles 1 to the sum of diffraction intensities I0(hkl) obtained from non-oriented samples of the hexagonal ferrite particles 1. In Formula (2), variable h, variable k, variable l, variable x, variable y, and variable z are integers.

$$P0=\Sigma I0(xyz)/\Sigma I0(hkl) \tag{2}$$

The reference peak intensity P0 is used as a correction value for the peak intensity P in Formula (1), and the peak intensity P is corrected such that the degree F. of c-plane orientation in a non-oriented sample of the hexagonal ferrite particles 1 becomes 0. The reference peak intensity P0 may be regarded as P0=0.05 in the calculation of the degree F. of c-plane orientation of the hexagonal ferrite particles 1.

The peak intensity P is calculated by using a measured value of the X-ray diffraction intensity I obtained from an oriented sample of the hexagonal ferrite particles 1, such as the radio wave absorber 100. When the crystal orientation plane of the radio wave absorber 100 is a (00I) plane, the peak intensity P is represented by the ratio of the sum of diffraction intensities I(00I) obtained from the crystal orientation planes (00I) of oriented samples of the hexagonal ferrite particles 1 to the sum of diffraction intensities I(hkl) obtained from oriented samples of the hexagonal ferrite particles 1 as shown in Formula (3).

$$P=\Sigma I(00I)/\Sigma I(hkl) \quad (3)$$

As long as the degree f of c-plane orientation of the hexagonal ferrite particles 1 in the radio wave absorber 100 is 0.4 or less, the c-planes of the hexagonal ferrite particles 1 are randomly oriented. Therefore, the radio wave absorber 100 has radio wave absorption performance for radio waves arriving from various directions when the degree f of c-plane orientation of the hexagonal ferrite particles 1 is 0.4 or less.

As the degree f of c-plane orientation of the hexagonal ferrite particles 1 exceeds 0.4 and approaches 1, the anisotropy of the radio wave absorption performance decreases, and there is more tendency for the hexagonal ferrite particles 1 to absorb only radio waves arriving from a particular direction and not to absorb radio waves arriving from the other directions. Therefore, the radio wave absorber 100 in which the degree f of c-plane orientation of the hexagonal ferrite particles 1 exceeds 0.4 may not have an effective radio wave absorption performance in applications where radio waves arrive from various directions.

When the c-planes of the hexagonal ferrite particles 1 are completely randomly oriented, the degree f of c-plane orientation is 0. It is, however, practically difficult to completely randomly orient the c-planes of the hexagonal ferrite particles 1 in the production of the radio wave absorber 100.

From the foregoing, the degree f of c-plane orientation of the hexagonal ferrite particles 1 is preferably 0.04 or more and 0.35 or less. When the degree f of c-plane orientation of the hexagonal ferrite particles 1 is 0.04 or more and 0.35 or less, it is possible to improve both the ease of production of the radio wave absorber 100 and the radio wave absorption performance of the radio wave absorber 100.

The radio wave absorber 100 having a single layer is described above. A radio wave absorber 100 having two or more layers provides the same advantageous effects. Next, an example radio wave absorber 100 having two or more layers will be described with reference to FIG. 2.

Figure 2:
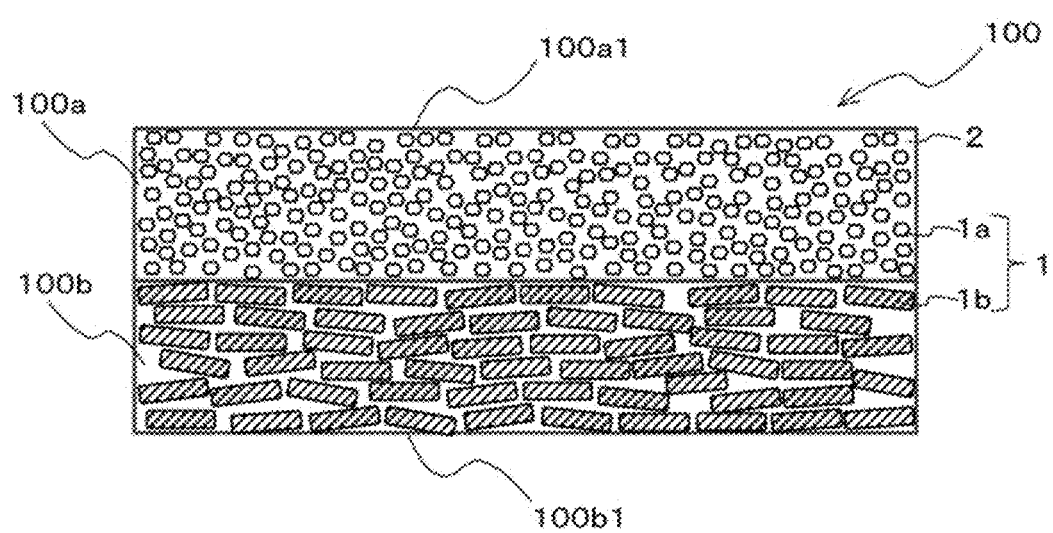
FIG. 2 is a modification of the radio wave absorber illustrated in FIG. 1.

FIG. 2 is a modification of the radio wave absorber 100 illustrated in FIG. 1. The radio wave absorber 100 has a first radio wave absorbing layer 100a and a second radio wave absorbing layer 100b. In FIG. 2, the radio wave absorber 100 having a two-layer structure including the second radio wave absorbing layer 100b and the first radio wave absorbing layer 100a directly stacked on top of each other is illustrated. The radio wave absorber 100 is not limited to such a two-layer structure. For example, the radio wave absorber 100 may have a multi-layer structure with three or more layers, in which the second radio wave absorbing layer 100b and the first radio wave absorbing layer 100a are stacked on top of each other with one or more other radio wave absorbing layers interposed between the second radio wave absorbing layer 100b and the first radio wave absorbing layer 100a.

The first radio wave absorbing layer 100a has a first radio wave absorbing surface 100a1 of the radio wave absorber 100. The second radio wave absorbing layer 100b has a second radio wave absorbing surface 100b1 of the radio wave absorber 100, which is located opposite to the first radio wave absorbing surface 100a1. In the following description, the degree f of c-plane orientation of the hexagonal ferrite particles 1 in the first radio wave absorbing surface 100a1 is referred to as a first degree f1 of orientation, and the degree f of c-plane orientation of the hexagonal ferrite particles 1 in the second radio wave absorbing surface 100b1 is referred to as a second degree f2 of orientation.

In FIG. 2, the first radio wave absorbing layer 100a contains only the first particles 1a as the hexagonal ferrite particles 1, and the second radio wave absorbing layer 100b contains only the second particles 1b as the hexagonal ferrite particles 1. Other configurations are the same as those of the radio wave absorber 100 illustrated in FIG. 1 and will not be described here.

As described above, the aspect ratio of the first particles 1a is smaller than the aspect ratio of the second particles 1b. In the first radio wave absorbing layer 100a, the first particles 1a are thus mixed and dispersed in the holding material 2 with the c-planes of the first particles 1a randomly oriented. In the second radio wave absorbing layer 100b, the second particles 1b are mixed and dispersed in the holding material 2 with the c-planes of the second particles 1b oriented in a particular direction. In other words, in the radio wave absorber 100 illustrated in FIG. 2, the first degree f1 of orientation of the hexagonal ferrite particles 1 in the first radio wave absorbing surface 100a1 is smaller than the second degree f2 of orientation of the hexagonal ferrite particles 1 in the second radio wave absorbing surface 100b1.

Therefore, the first radio wave absorbing layer 100a in the radio wave absorber 100 illustrated in FIG. 2 improves the radio wave absorption performance for radio waves arriving from various directions. The second radio wave absorbing layer 100b in the radio wave absorber 100 illustrated in FIG. 2 improves the radio wave absorption performance for radio waves arriving from a particular direction. By disposing the first radio wave absorbing layer 100a and the second radio wave absorbing layer 100b, the radio wave absorption performance of each layer is specialized for a specific frequency band to further improve the radio wave absorption performance.

The configuration in which the first degree f1 of orientation of the hexagonal ferrite particles 1 in the first radio wave absorbing surface 100a1 is smaller than the second degree f2 of orientation of the hexagonal ferrite particles 1 in the second radio wave absorbing surface 100b1 is not limited to that illustrated in FIG. 2. The same configuration is obtained by, for example, forming the first radio wave absorbing layer 100a such that the amount of the first particles 1a is larger than the amount of the second particles 1b and forming the second radio wave absorbing layer 100b such that the amount of the second particles 1b is larger than the amount of the first particles 1a. The radio wave absorber 100 may have a multi-layer structure with three or more layers, in which another radio wave absorbing layer having a degree of orientation different from the first degree f1 of orientation and the second degree f2 of orientation is disposed between the second radio wave absorbing layer 100b and the first radio wave absorbing layer 100a.

Figure 3:
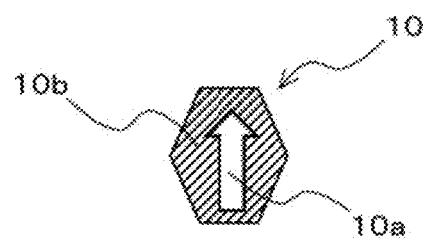
FIG. 3 is a schematic view of a single-domain particle contained in the radio wave absorber according to Embodiment 1.
Figure 4:
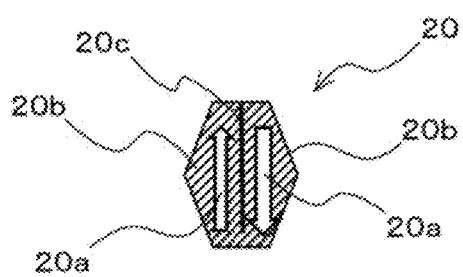
FIG. 4 is a schematic view of a multi-domain particle contained in the radio wave absorber according to Embodiment 1.

Next, the magnetic domain structure of the hexagonal ferrite particles 1 will be described with reference to FIG. 3 and FIG. 4. FIG. 3 is a schematic view of a single-domain particle 10 contained in the radio wave absorber 100 according to Embodiment 1. FIG. 4 is a schematic view of a multi-domain particle 20 contained in the radio wave absorber 100 according to Embodiment 1. The shape of the single-domain particle 10 illustrated in FIG. 3 and the shape of the multi-domain particle 20 illustrated in FIG. 4 are schematically illustrated and may be different from the shapes of actual hexagonal ferrite particles 1.

The magnetic loss properties of the hexagonal ferrite particles 1 change depending on the magnetic domain structure of the hexagonal ferrite particles 1, and the radio wave absorption performance in a frequency band in which the magnetic loss of the hexagonal ferrite particles 1 reaches the maximum possible changes depending on the magnetic domain structure of the hexagonal ferrite particles 1. The hexagonal ferrite particles 1 are roughly classified into single-domain particles 10 and multi-domain particles 20, which are particles other than the single-domain particles 10, by the magnetic domain structure.

As illustrated in FIG. 3, the single-domain particle 10 is a magnetic particle entirely formed by a single magnetic domain 10b and having a magnetic moment 10a in a single direction inside the magnetic domain 10b. As illustrated in FIG. 4, the multi-domain particle 20 is a magnetic particle having at least one magnetic wall 20c inside the particle. Magnetic domains 20b are divided by the at least one magnetic wall 20c. The multi-domain particle 20 has a magnetic moment 20a in each of the magnetic domains 20b.

As illustrated in FIG. 4, the multi-domain particle 20 has multiple magnetic domains 20b divided by the magnetic wall 20c, and the magnetic moments 20a with opposite orientations are thus easily formed in each of the magnetic domains 20b. Unlike the multi-domain particle 20, the single-domain particle 10 has no magnetic wall 20c and thus has only the magnetic moment 10a in a single direction inside the particle. Therefore, the coercivity of the single-domain particle 10 is larger than the coercivity of the multi-domain particle 20.

As illustrated in FIG. 1, the first particles 1a have first single-domain particles 1a1, and the second particles 1b have second single-domain particles 1b1 in the hexagonal ferrite particles 1 of the radio wave absorber 100. Having the first single-domain particles 1a1 and the second single-domain particles 1b1, the hexagonal ferrite particles 1 improves the coercivity of the radio wave absorber 100 and thus improves the radio wave absorption performance in a frequency band in which the hexagonal ferrite particles 1 have magnetic loss properties.

In the following description, the single-domain particles 10 refer to both the first single-domain particles 1a1 and the second single-domain particles 1b1, unless otherwise distinguished. The multi-domain particles 20 refer to both the first particles 1a other than the first single-domain particles 1a1 and the second particles 1b other than the second single-domain particles 1b1.

The amount of the single-domain particles 10 in the hexagonal ferrite particles 1 is expressed by the area ratio of the single-domain particles 10 in the hexagonal ferrite particles 1 and calculated from Formula (4).

Amount (%) of single-domain particles 10=(area of single-domain particles 10/area of hexagonal ferrite particles 1)×100  (4)

The area of the single-domain particles 10 is the area of the first single-domain particles 1a1 and the area of the second single-domain particles 1b1 in the cross-section of the radio wave absorber 100. The area of the hexagonal ferrite particles 1 may be regarded as the sum of the area of the single-domain particles 10 and the area of the multi-domain particles 20.

The area of the single-domain particles 10 and the area of the multi-domain particles 20 are calculated by, for example, observing the magnetic domains in the cross-section of the radio wave absorber 100 using, for example, a scanning probe microscope and a Kerr effect polarization microscope. The cross-section of the radio wave absorber 100 is subjected to image processing such as imaging to measure each of the area of the single-domain particles 10 and the area of the multi-domain particles 20.

As the amount of the single-domain particles 10 increases, the radio wave absorption performance of the radio wave absorber 100 in a frequency band in which the hexagonal ferrite particles 1 have magnetic loss properties increases. Therefore, the amount of the single-domain particles 10 is preferably 30% or more. The amount of the single-domain particles 10 is preferably 50% or more, more preferably 70% or more to improve the radio wave absorption performance of the radio wave absorber 100.

Next, a method for producing the radio wave absorber 100 will be described.

The hexagonal ferrite particles 1 are produced by pulverizing a hexagonal ferrite powder having a particle size of about 0.2 to 1 mm using, for example, an attritor, a ball mill, or a bead mill. The hexagonal ferrite powder may be prepared by, for example, a solid phase reaction method, a coprecipitation method, a reverse micelle method, a hydrothermal synthesis method, or a glass crystallization method from material compounds, such as an oxide and a carbonate containing a metal that will form the ferrite. The hexagonal ferrite powder and the hexagonal ferrite particles 1 may be commercial products.

The hexagonal ferrite particles 1 are mixed and dispersed in the heat-melted holding material 2 and prepared as a resin composition. The hexagonal ferrite particles 1 may be mixed with the heat-melted holding material 2 by any process, such as batch operation and continuous operation, of, for example, an extruder with a roller, such as a single-screw extruder, a twin-screw extruder, and a multi-screw extruder, or a Banbury mixer, a roller, a co-kneader, a blast mill, or a brabender plastograph.

The resin composition is cooled and, after cooling, magnetized by a magnetizer. The resin composition is magnetized by, for example, applying a magnetic field having a strength sufficient for the maximum possible magnetic flux density of the resin composition to reach a saturation point. The resin composition is magnetized by any magnetization method, such as a static magnetic field generation method using a DC electromagnet and a pulse magnetic field generation method using a capacitor magnetizer.

The magnetized resin composition is heat-melted at a temperature at which the holding material 2 melts and formed into a predetermined shape. The resin composition is formed into any shape as long as the resin composition is used as the radio wave absorber 100. For example, the shape of the resin composition is preferably a sheet shape.

In the above forming process, the resin composition may be pulverized before the resin composition is heat-melted. The pulverization of the resin composition facilitates heat melting of the resin composition and thus improves workability in the heat-melting process.

In the case of producing the radio wave absorber 100 having two layers as illustrated in FIG. 2, a sheet in which the hexagonal ferrite particles 1 having a particle size of less than 1 μm are dispersed and a sheet in which the hexagonal ferrite particles 1 having a particle size of 5 µm or more are dispersed are each prepared in the above process. The radio wave absorber 100 is produced by attaching the prepared two sheets to each other. These two sheets may be attached to each other by any method, such as thermocompression bonding and adhesion with an adhesive or an adhesive tape.

The above method for producing the radio wave absorber 100 is illustrative only. The method for producing the radio wave absorber 100 is not limited to the above method. The radio wave absorber 100 may be produced by other production methods known in the related art. For example, the process for forming the resin composition may involve injecting, into a mold, such as a metal mold, a resin mixture prepared by mixing a pellet-shaped holding material 2 and the hexagonal ferrite particles 1, and heating the mold with a heater, such as a molding machine heating cylinder, to melt the resin mixture and thus to form a resin composition having a predetermined shape. This forming process eliminates the step of preparing a resin composition involving melting the holding material 2 and thus reduces the number of steps in producing the radio wave absorber 100.

EXAMPLES

Embodiment 1 reveals that the radio wave absorber 100 having an effective radio wave absorption performance in a frequency band of 20 GHz or higher, particularly a millimeter wave band from 30 to 300 GHz, is provided by controlling the particle size and the magnetic domain structure of the hexagonal ferrite particles 1 in Examples described below. It is also found that the radio wave absorber 100 having an effective radio wave absorption performance for radio waves arriving from various directions is provided by controlling the degree of orientation of the hexagonal ferrite particles 1 when the holding material 2 is filled with the hexagonal ferrite particles 1 in Examples described below. Examples will be specifically described below, but the present disclosure is not limited by these Examples.

In Examples, an M-type hexagonal ferrite having a composition of $BaFe_{12}O_{19}$ was used as a hexagonal ferrite. Ferrite samples A to G containing first particles 1a with a particle size of less than 1 µm and second particles 1b with a particle size of 5 µm or more and different in the amounts of the first particles 1a and the second particles 1b were prepared by using an M-type hexagonal ferrite powder with a particle size of 0.3 mm. The ferrite samples A to G were prepared by pulverizing the M-type hexagonal ferrite powder with a ball mill and then further finely pulverizing the pulverized powder with a bead mill. By changing the pulverization time in the bead mill, the amount of the first particles 1a with a particle size of less than 1 µm and the amount of the second particles 1b with a particle size of 5 µm or more in the ferrite samples A to G were controlled.

The amount of the first particles 1a with a particle size of less than 1 µm and the amount of the second particles 1b with a particle size of 5 µm or more contained in the ferrite samples A to G were calculated by measuring the particle size distribution by the laser diffraction scattering method and performing normalization in weight percent unit. The amount of the first particles 1a with a particle size of less than 1 µm and the amount of the second particles 1b with a particle size of 5 µm or more contained in the ferrite samples A to G were shown in Table 1.

TABLE 1

| Ferrite sample | Amount of first particles of less than 1 µm (weight percent) | Amount of second particles of 5 µm or more (weight percent) |
| --- | --- | --- |
| A | 63 | 0 |
| B | 55 | 10 |
| C | 46 | 13 |
| D | 32 | 30 |
| E | 23 | 47 |
| F | 14 | 52 |
| G | 0 | 71 |

As shown in Table 1, in the ferrite sample A, the amount of the first particles 1a with a particle size of less than 1 µm was 63 weight percent, and the amount of the second particles 1b with a particle size of 5 µm or more was 0 weight percent. In the ferrite sample B, the amount of the first particles 1a with a particle size of less than 1 m was 55 weight percent, and the amount of the second particles 1b with a particle size of 5 µm or more was 10 weight percent. In the ferrite sample C, the amount of the first particles 1a with a particle size of less than 1 µm was 46 weight percent, and the amount of the second particles 1b with a particle size of 5 µm or more was 13 weight percent. In the ferrite sample D, the amount of the first particles 1a with a particle size of less than 1 µm was 32 weight percent, and the amount of the second particles 1b with a particle size of 5 µm or more was 30 weight percent. In the ferrite sample E, the amount of the first particles 1a with a particle size of less than 1 µm was 23 weight percent, and the amount of the second particles 1b with a particle size of 5 µm or more was 47 weight percent. In the ferrite sample F, the amount of the first particles 1a with a particle size of less than 1 µm was 14 weight percent, and the amount of the second particles 1b with a particle size of 5 µm or more was 52 weight percent. In the ferrite sample G, the amount of the first particles 1a with a particle size of less than 1 µm was 0 weight percent, and the amount of the second particles 1b with a particle size of 5 m or more was 71 weight percent.

Radio wave absorber samples of Examples 1 to 5, Comparative Example 1, and Comparative Example 2 were produced as described below to study the effect of the particle size of the hexagonal ferrite particles 1. As described below, the radio wave absorber samples of Examples 1 to 5, Comparative Example 1, and Comparative Example 2 were different in the amount of the first particles 1a with a particle size of less than 1 µm and the amount of the second particles 1b with a particle size of 5 µm or more, but were the same in terms of other conditions for producing the radio wave absorber samples.

Example 1

A resin composition was prepared by adding 900 parts by mass of the ferrite sample D to 100 parts by mass of a chlorinated polyethylene resin and mixing the resulting mixture at a temperature of 180 degrees C. The prepared resin composition was magnetized by application of a 1.2-T magnetic field using a magnetizer. The magnetized resin composition was pulverized into a size of about several centimeters with a pulverizer and formed into a sheet shape at a temperature of 180 degrees C. using a twin-screw extruder having rollers to produce the radio wave absorber sample of Example 1.

Example 2

In Example 2, a resin composition was prepared by adding 900 parts by mass of the ferrite sample B to 100 parts by mass of a chlorinated polyethylene resin and mixing the resulting mixture at a temperature of 180 degrees C. The resin composition was subjected to the same magnetizing process and the same forming process as in Example 1 to produce the radio wave absorber sample of Example 2.

Example 3

In Example 3, a resin composition was prepared by adding 900 parts by mass of the ferrite sample C to 100 parts by mass of a chlorinated polyethylene resin and mixing the resulting mixture at a temperature of 180 degrees C. The resin composition was subjected to the same magnetizing process and the same forming process as in Example 1 to produce the radio wave absorber sample of Example 3.

Example 4

In Example 4, a resin composition was prepared by adding 900 parts by mass of the ferrite sample E to 100 parts by mass of a chlorinated polyethylene resin and mixing the resulting mixture at a temperature of 180 degrees C. The resin composition was subjected to the same magnetizing process and the same forming process as in Example 1 to produce the radio wave absorber sample of Example 4.

Example 5

In Example 5, a resin composition was prepared by adding 900 parts by mass of the ferrite sample F to 100 parts by mass of a chlorinated polyethylene resin and mixing the resulting mixture at a temperature of 180 degrees C. The resin composition was subjected to the same magnetizing process and the same forming process as in Example 1 to produce the radio wave absorber sample of Example 5.

Comparative Example 1

In Comparative Example 1, a resin composition was prepared by adding 900 parts by mass of the ferrite sample A to 100 parts by mass of a chlorinated polyethylene resin and mixing the resulting mixture at a temperature of 180 degrees C. The resin composition was subjected to the same magnetizing process and the same forming process as in Example 1 to produce the radio wave absorber sample of Comparative Example 1.

Comparative Example 2

In Comparative Example 2, a resin composition was prepared by adding 900 parts by mass of the ferrite sample G to 100 parts by mass of a chlorinated polyethylene resin and mixing the resulting mixture at a temperature of 180 degrees C. The resin composition was subjected to the same magnetizing process and the same forming process as in Example 1 to produce the radio wave absorber sample of Comparative Example 2.

The proportion of the area of the single-domain particles 10 to the total area of the hexagonal ferrite particles 1 in each of the radio wave absorber samples of Examples 1 to 5, Comparative Example 1, and Comparative Example 2 was calculated in percentage as shown in Formula (4) described above, and the calculated value was evaluated as the amount of the single-domain particles 10.

The degree f of c-plane orientation of the hexagonal ferrite particles 1 in two planes of each of the radio wave absorber samples having a sheet shape of Examples 1 to 5, Comparative Example 1, and Comparative Example 2 was calculated by the Lotgering method described above, and the degree f of c-plane orientation was thus quantitatively evaluated.

The radio wave absorption performance of the radio wave absorber samples of Examples 1 to 5, Comparative Example 1, and Comparative Example 2 for electromagnetic waves at 28 GHz and 79 GHz was quantitatively evaluated. The radio wave absorption performance was quantitatively evaluated by calculating the amount of radio wave attenuation of electromagnetic waves at 28 GHz and 79 GHz in the radio wave absorber samples. The amount of radio wave attenuation was measured by using a free-space method involving placing a radio wave absorber sample in free space and causing a focused plane wave to strike the radio wave absorber sample to measure the reflection coefficient of the radio wave absorber sample. The amount of radio wave attenuation of the radio wave absorber sample was calculated from a difference between the reflection coefficient measured from the radio wave absorber sample and the reference reflection coefficient measured from an aluminum plate. The amount of radio wave attenuation of the radio wave absorber samples of Examples 1 to 5, Comparative Example 1, and Comparative Example 2 was divided by the amount of radio wave attenuation of the radio wave absorber sample of Example 1 and normalized as a value relative to the amount of radio wave attenuation of the radio wave absorber sample of Example 1.

Table 2 shows the data on the proportion of the area of the single-domain particles 10, the degree f of c-plane orientation of the hexagonal ferrite particles 1, and the amount of radio wave attenuation in the radio wave absorber samples of Examples 1 to 5, Comparative Example 1, and Comparative Example 2. In Table 2, one plane of each radio wave absorber sample having a sheet shape is referred to as a "first surface", and the other plane is referred to as a "second surface" in the data on the degree f of c-plane orientation of the hexagonal ferrite particles 1 in each of the planes.

TABLE 2

| | | Examples | | | | | Comparative Examples | |
|---|---|---|---|---|---|---|---|---|
| | | 1 | 2 | 3 | 4 | 5 | 1 | 2 |
| Thermoplastic resin [parts by mass] | | 100 | 100 | 100 | 100 | 100 | 100 | 100 |
| Ferrite sample [parts by mass] | A | | | | | | 900 | |
| | B | | 900 | | | | | |
| | C | | | 900 | | | | |
| | D | 900 | | | | | | |
| | E | | | | 900 | | | |
| | F | | | | | 900 | | |
| | G | | | | | | | 900 |

TABLE 2-continued

|  |  | Examples | | | | | Comparative Examples | |
| --- | --- | --- | --- | --- | --- | --- | --- | --- |
|  |  | 1 | 2 | 3 | 4 | 5 | 1 | 2 |
| Proportion of single-domain particles [%] | | 87 | 93 | 86 | 81 | 78 | 84 | 83 |
| Degree of c-plane orientation (F value) [−] | First surface | 0.35 | 0.28 | 0.3 | 0.36 | 0.4 | 0.15 | 0.65 |
|  | Second surface | 0.36 | 0.29 | 0.31 | 0.36 | 0.39 | 0.14 | 0.66 |
| Radio wave absorption properties | Amount of radio wave attenuation (at 28 GHz) [−] | 1 | 1.0 | 1.0 | 1.1 | 1.1 | 0.4 | 1.3 |
|  | Amount of radio wave attenuation (at 79 GHz) [−] | 1 | 1.1 | 1.0 | 0.9 | 1.0 | 1.2 | 0.3 |

The proportion of the area of the single-domain particles 10 to the total area of the hexagonal ferrite particles 1 in the radio wave absorber sample of Example 1 was 87%. The proportion of the area of the single-domain particles 10 to the total area of the hexagonal ferrite particles 1 in the radio wave absorber sample of Example 2 was 93%. The proportion of the area of the single-domain particles 10 to the total area of the hexagonal ferrite particles 1 in the radio wave absorber sample of Example 3 was 86%. The proportion of the area of the single-domain particles 10 to the total area of the hexagonal ferrite particles 1 in the radio wave absorber sample of Example 4 was 81%. The proportion of the area of the single-domain particles 10 to the total area of the hexagonal ferrite particles 1 in the radio wave absorber sample of Example 5 was 78%.

In the radio wave absorber samples of Examples 1 to 5, the amount of the single-domain particles 10 after magnetization increases as the amount of the first particles 1a with a particle size of less than 1 μm increases above the amount of the second particles 1b with a particle size of 5 μm or more.

In the radio wave absorber sample of Example 1, the degree f of c-plane orientation of the hexagonal ferrite particles 1 in the first surface was 0.35, and the degree f of c-plane orientation of the hexagonal ferrite particles 1 in the second surface was 0.36. In the radio wave absorber sample of Example 2, the degree f of c-plane orientation of the hexagonal ferrite particles 1 in the first surface was 0.28, and the degree f of c-plane orientation of the hexagonal ferrite particles 1 in the second surface was 0.29. In the radio wave absorber sample of Example 3, the degree f of c-plane orientation of the hexagonal ferrite particles 1 in the first surface was 0.3, and the degree f of c-plane orientation of the hexagonal ferrite particles 1 in the second surface was 0.31. In the radio wave absorber sample of Example 4, the degree f of c-plane orientation of the hexagonal ferrite particles 1 in the first surface was 0.36, and the degree f of c-plane orientation of the hexagonal ferrite particles 1 in the second surface was 0.36. In the radio wave absorber sample of Example 5, the degree f of c-plane orientation of the hexagonal ferrite particles 1 in the first surface was 0.4, and the degree f of c-plane orientation of the hexagonal ferrite particles 1 in the second surface was 0.39. The degrees f of c-plane orientation of the hexagonal ferrite particles 1 in both surfaces of the radio wave absorber samples were in substantially the same range.

In the radio wave absorber samples of Examples 1 to 5, the degrees f of c-plane orientation of the hexagonal ferrite particles 1 in both surfaces of each of the radio wave absorber samples decreased as the amount of the first particles 1a with a particle size of less than 1 μm increased above the amount of the second particles 1b with a particle size of 5 μm or more.

In the radio wave absorber samples of Examples 1 to 5, the amount of radio wave attenuation of electromagnetic waves at 28 GHz was in the range of 1.0 to 1.1, and the amount of radio wave attenuation of electromagnetic waves at 79 GHz was in the range of 0.9 to 1.1. The radio wave absorber samples of Examples 1 to 5 thus had an effective radio wave absorption performance.

In the radio wave absorber sample of Comparative Example 1 containing only the first particles 1a with a particle size of less than 1 μm, the proportion of the area of the single-domain particles 10 to the total area of the hexagonal ferrite particles 1 was 84%, which was similar to the values of the radio wave absorber samples of Examples 1 to 5. However, the degree f of c-plane orientation of the radio wave absorber sample of Comparative Example 1 was lower than the degree f of c-plane orientation of each of the radio wave absorber samples of Examples 1 to 5. Specifically, the degree f of c-plane orientation of the hexagonal ferrite particles 1 in the first surface was 0.15. The degree f of c-plane orientation of the hexagonal ferrite particles 1 in the second surface was 0.14. In the radio wave absorber sample of Comparative Example 1, the amount of radio wave attenuation of electromagnetic waves at 79 GHz was 1.2, but the amount of radio wave attenuation of electromagnetic waves at 28 GHz was 0.4. The radio wave absorber sample of Comparative Example 1 thus did not have an effective radio wave absorption performance for electromagnetic waves at 28 GHz.

In the radio wave absorber sample of Comparative Example 2 containing only the second particles 1b with a particle size of 5 μm or more, the proportion of the area of the single-domain particles 10 to the total area of the hexagonal ferrite particles 1 was 83%, which was similar to the values of the radio wave absorber samples of Examples 1 to 5. However, the degree F. of c-plane orientation of the radio wave absorber sample of Comparative Example 2 was higher than the degree F. of c-plane orientation of each of the radio wave absorber samples of Examples 1 to 5. Specifically, the degree F. of c-plane orientation of the hexagonal ferrite particles 1 in the first surface was 0.65. The degree F. of c-plane orientation of the hexagonal ferrite particles 1 in the second surface was 0.66. In the radio wave absorber sample of Comparative Example 2, the amount of radio wave attenuation of electromagnetic waves at 28 GHz was 1.3, but the amount of radio wave attenuation of electromagnetic waves at 79 GHz was 0.3. The radio wave absorber sample of Comparative Example 2 thus did not have an effective radio wave absorption performance for electromagnetic waves at 79 GHz.

The results of Examples 1 to 5 indicate that the radio wave absorber 100 having the hexagonal ferrite particles 1 containing the first particles 1a and the second particles 1b, which are larger than the first particles 1a in particle size, is formed to have an effective radio wave absorption performance in a frequency band of 20 GHz or higher. In particular, the results of Examples 1 to 5 indicate that the radio wave absorber 100 having an effective radio wave absorption performance in a millimeter wave band from 30 to 300 GHz is provided.

A ferrite material having radio wave absorption performance in the related art includes only ferrite particles having a uniform particle size and does not include ferrite particles having multiple particle sizes. As shown in Comparative Example 1 and Comparative Example 2, the use of only ferrite particles having a uniform particle size is not expected to provide an effect of reducing electromagnetic noise both in the 28-GHz band used in high frequency communication systems and in a millimeter wave band, such as the 79-GHz band, used in collision avoidance radars.

A large degree f of c-plane orientation of the ferrite particles in the ferrite material results in large anisotropy of the ferrite particles. The ferrite particles having large anisotropy provide an effect of absorbing electromagnetic noise coming from a certain direction but do not provide an effect of absorbing electromagnetic noise coming from various directions. As shown in Comparative Example 2, the degree f of c-plane orientation of the ferrite particles is large in the ferrite material containing only ferrite particles having a large particle size. Therefore, for example, when a high frequency device, such as a high frequency communication device and a millimeter wave radar, with the ferrite material of Comparative Example 2 attached is placed on, for example, an external wall to prevent interference, electromagnetic noise comes from various directions, and a sufficient radio wave absorption performance is thus not expected.

However, Examples 1 to 5 indicate that the use of the radio wave absorber 100 including the first particles 1a and the second particles 1b, which are larger than the first particles 1a in particle size, reduces electromagnetic noise in both the 28-GHz band and the 79-GHz band. In particular, when the first particle size of the first particles 1a is less than 1 μm, and the second particle size of the second particles 1b is 5 μm or more, an effective radio wave absorption performance is obtained and electromagnetic noise is reduced in both the 28-GHz band and the 79-GHz band. Examples 1 to 5 also indicate that the use of the radio wave absorber 100 including the first particles 1a and the second particles 1b, which are larger than the first particles 1a in particle size, results in a low degree of c-plane orientation compared with a ferrite material containing only the second particles 1b and thus provides an effect of absorbing electromagnetic noise coming from various directions. It is also found that, as the amount of the first particles 1a increases above the amount of the second particles 1b, the amount of the single-domain particles 10 after magnetization increases, and the degree of c-plane orientation of the hexagonal ferrite particles 1 decreases to provide an effect of absorbing electromagnetic noise coming from various directions.

Next, radio wave absorber samples of Examples 6 to 9, Comparative Example 3, and Comparative Example 4 were produced to study the effect of the magnetic domain structure of the hexagonal ferrite particles 1. As described below, the radio wave absorber samples of Examples 6 to 9, Comparative Example 3, and Comparative Example 4 were different from Example 1 in the magnetic field strength applied in the magnetizing process, but were the same as Example 1 in terms of other conditions for producing the radio wave absorber samples. The magnetic field strength applied in the magnetizing process in Example 1 was 1.2 T.

Example 6

A resin composition prepared in the same manner as in Example 1 was magnetized by application of a 0.8-T magnetic field. The resin composition was subjected to the same forming process as in Example 1 to produce the radio wave absorber sample of Example 6.

Example 7

A resin composition prepared in the same manner as in Example 1 was magnetized by application of a 0.7-T magnetic field. The resin composition was subjected to the same forming process as in Example 1 to produce the radio wave absorber sample of Example 7.

Example 8

A resin composition prepared in the same manner as in Example 1 was magnetized by application of a 0.6-T magnetic field. The resin composition was subjected to the same forming process as in Example 1 to produce the radio wave absorber sample of Example 8.

Example 9

A resin composition prepared in the same manner as in Example 1 was magnetized by application of a 0.5-T magnetic field. The resin composition was subjected to the same forming process as in Example 1 to produce the radio wave absorber sample of Example 9.

Comparative Example 3

A resin composition prepared in the same manner as in Example 1 was magnetized by application of a 0.35-T magnetic field. The resin composition was subjected to the same forming process as in Example 1 to produce the radio wave absorber sample of Comparative Example 3.

Comparative Example 4

A resin composition prepared in the same manner as in Example 1 was not magnetized. The resin composition was subjected to the same forming process as in Example 1 to produce the radio wave absorber sample of Comparative Example 4.

The data on the proportion of the area of the single-domain particles 10, the degree f of c-plane orientation of the hexagonal ferrite particles 1, and the amount of radio wave attenuation in the radio wave absorber samples of Example 1, Examples 6 to 9, Comparative Example 3, and Comparative Example 4 are shown in Table 3. The method for evaluating each piece of the data is the same as that in Examples 1 to 5 described above and thus will not be described. The data of Example 1 shown in Table 3 are the same as the data of Example 1 shown in Table 2.

TABLE 3

|  |  | Examples | | | | | Comparative Examples | |
|---|---|---|---|---|---|---|---|---|
|  |  | 1 | 6 | 7 | 8 | 9 | 3 | 4 |
| Thermoplastic resin [parts by mass] | | 100 | 100 | 100 | 100 | 100 | 100 | 100 |
| Ferrite sample [parts by mass] | A | | | | | | | |
| | B | | | | | | | |
| | C | | | | | | | |
| | D | 900 | 900 | 900 | 900 | 900 | 900 | 900 |
| | E | | | | | | | |
| | F | | | | | | | |
| | G | | | | | | | |
| Proportion of single-domain particles [%] | | 87 | 62 | 48 | 34 | 30 | 29 | 5 |
| Degree of c-plane orientation (F value) [–] | First surface | 0.35 | 0.35 | 0.34 | 0.32 | 0.34 | 0.36 | 0.37 |
| | Second surface | 0.36 | 0.34 | 0.33 | 0.32 | 0.35 | 0.35 | 0.35 |
| Radio wave absorption properties | Amount of radio wave attenuation (at 28 GHz) [–] | 1 | 0.9 | 0.8 | 0.8 | 0.6 | 0.4 | 0.2 |
| | Amount of radio wave attenuation (at 79 GHz) [–] | 1 | 0.9 | 0.8 | 0.8 | 0.7 | 0.4 | 0.2 |

In the radio wave absorber sample of Example 6, the proportion of the area of the single-domain particles 10 to the total area of the hexagonal ferrite particles 1 was 62%. In the radio wave absorber sample of Example 7, the proportion of the area of the single-domain particles 10 to the total area of the hexagonal ferrite particles 1 was 48%. In the radio wave absorber sample of Example 8, the proportion of the area of the single-domain particles 10 to the total area of the hexagonal ferrite particles 1 was 34%. In the radio wave absorber sample of Example 9, the proportion of the area of the single-domain particles 10 to the total area of the hexagonal ferrite particles 1 was 30%.

In the radio wave absorber sample of Example 6, the amounts of radio wave attenuation of electromagnetic waves at 28 GHz and 79 GHz were both 0.9. In the radio wave absorber sample of Example 7, the amounts of radio wave attenuation of electromagnetic waves at 28 GHz and 79 GHz were both 0.8. In the radio wave absorber sample of Example 8, the amounts of radio wave attenuation of electromagnetic waves at 28 GHz and 79 GHz were both 0.8. In the radio wave absorber sample of Example 9, the amount of radio wave attenuation of electromagnetic waves at 28 GHz was 0.6, and the amount of radio wave attenuation of electromagnetic waves at 79 GHz was 0.7.

In the radio wave absorber sample of Comparative Example 3 in which the proportion of the area of the single-domain particles 10 to the total area of the hexagonal ferrite particles 1 was 29%, the amounts of radio wave attenuation of electromagnetic waves at 28 GHz and 79 GHz were both 0.4. In the radio wave absorber sample of Comparative Example 4 in which the proportion of the area of the single-domain particles 10 to the total area of the hexagonal ferrite particles 1 was 5%, the amounts of radio wave attenuation of electromagnetic waves at 28 GHz and 79 GHz were both 0.2.

The degrees f of c-plane orientation of the radio wave absorber samples of Examples 6 to 9 in the first surface and the second surface were both in the range of 0.32 to 0.35. In the radio wave absorber sample of Comparative Example 3, the degree f of c-plane orientation in the first surface was 0.36, and the degree f of c-plane orientation in the second surface was 0.35. In the radio wave absorber sample of Comparative Example 4, the degree f of c-plane orientation in the first surface was 0.37, and the degree f of c-plane orientation in the second surface was 0.35.

Examples 6 to 9 show that, when the proportion of the area of the single-domain particles 10 to the total area of the hexagonal ferrite particles 1 was 30% or more, the amount of radio wave attenuation of electromagnetic waves at 28 GHz was maintained at 0.6 or more, and the amount of radio wave attenuation of electromagnetic waves at 79 GHz was maintained at 0.7 or more. Comparative Example 3 and Comparative Example 4 show that, when the proportion of the area of the single-domain particles 10 to the total area of the hexagonal ferrite particles 1 was less than 29%, the amounts of radio wave attenuation of electromagnetic waves at 28 GHz and 79 GHz were as low as 0.4 or less. Therefore, the results of Examples 6 to 9 indicate that, when the proportion of the area of the single-domain particles 10 to the total area of the hexagonal ferrite particles 1 was 30% or more, the amounts of radio wave attenuation of electromagnetic waves in the 28-GHz band and the 79-GHz band were maintained, and an effective radio wave absorption performance was obtained. The results of Examples 6 to 9 are obtained for the first time by focusing on the magnetic domain structure of the hexagonal ferrite particles 1.

Next, a radio wave absorber sample of Example 10 was produced to study the effect of the radio wave absorber 100 having a multi-layer structure compared with the radio wave absorber 100 having a single-layer structure of Example 1.

Example 10

A resin composition was prepared by adding 450 parts by mass of the ferrite sample A to 50 parts by mass of a chlorinated polyethylene resin and mixing the resulting mixture at a temperature of 180 degrees C. Next, a resin composition was prepared by adding 450 parts by mass of the ferrite sample G to 50 parts by mass of a chlorinated polyethylene resin and mixing the resulting mixture at a temperature of 180 degrees C. The prepared two resin compositions were magnetized by application of a 1.2-T magnetic field using a magnetizer. The magnetized two resin compositions were each pulverized into a size of about several centimeters with a pulverizer and formed into a sheet shape at a temperature of 180 degrees C. using a twin-screw extruder having rollers. The formed resin compositions having a sheet shape were attached to each other with a resin adhesive to produce a radio wave absorber sample of Example 10.

In Example 10, the resin composition having a sheet shape containing the ferrite sample A corresponds to the first radio wave absorbing layer 100a described above, and the resin composition having a sheet shape containing the ferrite sample G corresponds to the second radio wave absorbing layer 100b described above.

The data on the proportion of the area of the single-domain particles 10, the degree f of c-plane orientation of the hexagonal ferrite particles 1, and the amount of radio wave attenuation in the radio wave absorber samples of Example 1 and Example 10 are shown in Table 4. The method for evaluating each piece of the data is the same as that in Examples 1 to 9 described above and thus will not be described. The data of Example 1 shown in Table 4 are the same as the data of Example 1 shown in Table 2 and Table 3. The first surface shown in Table 4 corresponds to the first radio wave absorbing surface 100a1 described above, and the degree f of c-plane orientation in the first surface corresponds to the first degree f1 of c-plane orientation described above. The second surface shown in Table 4 corresponds to the second radio wave absorbing surface 100b1 described above, and the degree f of c-plane orientation in the second surface corresponds to the degree f2 of c-plane orientation described above.

TABLE 4

|  |  | Examples | |
|---|---|---|---|
|  |  | 1 | 10 |
| Thermoplastic resin [ parts by mass] | | 100 | 100 |
| Ferrite sample [parts by mass] | A | | 450 |
| | B | | |
| | C | | |
| | D | 900 | |
| | E | | |
| | F | | |
| | G | | 450 |
| Proportion of single-domain particles [%] | | 87 | 86 |
| Degree of c-plane orientation (f) [—] | First surface | 0.35 | 0.15 |
| | Second surface | 0.36 | 0.83 |
| Radio wave absorption performance | Amount of radio wave attenuation (at 28 GHz) [—] | 1 | 1.3 |
| | Amount of radio wave attenuation (at 79 GHz) [—] | 1 | 1.3 |

The proportion of the area of the single-domain particles 10 to the total area of the hexagonal ferrite particles 1 in the radio wave absorber sample of Example 10 was 86%. In the radio wave absorber sample of Example 10, the degree f of c-plane orientation in the first surface was 0.15, and the degree f of c-plane orientation in the second surface was 0.83. In the radio wave absorber sample of Example 10, the amounts of radio wave attenuation of electromagnetic waves at 28 GHz and 79 GHz were both 1.3.

In the radio wave absorber sample of Example 10, the degree f of c-plane orientation in the first surface is smaller than the degree f of c-plane orientation in the second surface. The degree f of c-plane orientation in the first surface of the radio wave absorber sample of Example 10 is smaller than the degree f of c-plane orientation in the second surface of the radio wave absorber sample of Example 1. The degree f of c-plane orientation in the second surface of the radio wave absorber sample of Example 10 is larger than the degree f of c-plane orientation in the second surface of the radio wave absorber sample of Example 1. The amounts of radio wave attenuation of electromagnetic waves at 28 GHz and 79 GHz in the radio wave absorber sample of Example 10 are each larger than the corresponding one of the amounts of radio wave attenuation of electromagnetic waves at 28 GHz and 79 GHz in Example 1, and an indication is thus provided that the radio wave absorption performance is improved in Example 10.

Therefore, Example 10 indicates that the radio wave absorber 100 has an effective radio wave absorption performance when the radio wave absorber 100 having two types of particles with different sizes has a multi-layer structure with two or more layers and the degree f of c-plane orientation in the first surface is smaller than the degree f of c-plane orientation in the second surface.

Examples 1 to 10 indicate that the radio wave absorber 100 having radio wave absorption performance in a frequency band of 20 GHz or higher and having less anisotropy and capable of absorbing radio waves arriving from various directions is provided by controlling the particle size and the magnetic domain structure of crystal particles. In particular, Examples 1 to 10 indicate that the radio wave absorber 100 having an effective radio wave absorption performance in intended frequency bands, such as the 28-GHz band and the 79-GHz band, is provided.

REFERENCE SIGNS LIST

1: hexagonal ferrite particle, 1a: first particle, 1a1: first single-domain particle, 1b: second particle, 1b1: second single-domain particle, 2: holding material, 10: single-domain particle, 10a: magnetic moment, 10b: magnetic domain, 20: multi-domain particle, 20a: magnetic moment, 20b: magnetic domain, 20c: magnetic wall, 100: radio wave absorber, 100a: first radio wave absorbing layer, 100a1: first radio wave absorbing surface, 100b: second radio wave absorbing layer, 100b1: second radio wave absorbing surface

The invention claimed is:

1. A radio wave absorber comprising:
a first radio wave absorbing layer having a first radio wave absorbing surface of the radio wave absorber, the first radio wave absorbing layer including:
first hexagonal ferrite particles; and
a holding material filled with the first hexagonal ferrite particles; and
a second radio wave absorbing layer having a second radio wave absorbing surface of the radio wave absorber, the second radio wave absorbing layer being located opposite to the first radio wave absorbing surface, the second radio wave absorbing layer including:
second hexagonal ferrite particles; and
a holding material filled with the second hexagonal ferrite particles, wherein
the second radio wave absorbing layer is directly stacked on the first radio wave absorbing layer,
the second hexagonal ferrite particles are larger than the first hexagonal ferrite particles in particle size,
each of the first hexagonal ferrite particles have a first particle size of 0.05 μm or more and less than 1 μm,
each of the second hexagonal ferrite particles have a second particle size of 5 μm or more and 100 μm or less,
the first hexagonal ferrite particles including first single-domain particles,
the second hexagonal ferrite particles including second single-domain particles, a proportion of an area of the first single-domain particles and the second single-domain particles to an area of the first and second hexagonal ferrite particles being 30 percent or more, and wherein the radio wave absorber is configured to absorb noise in the 28-GHz band and the 79-GHz band.

2. The radio wave absorber of claim 1, wherein a first degree of orientation of the first hexagonal ferrite particles in the first radio wave absorbing surface is smaller than a second degree of orientation of the second hexagonal ferrite particles in the second radio wave absorbing surface, the first degree of orientation of the first hexagonal ferrite particles being a degree of convergence of the orientation of a normal to a c-plane of the first hexagonal ferrite particles in the first radio wave absorbing surface, and the second degree of orientation of the second hexagonal ferrite particles being a degree of convergence of the orientation of a normal to a c-plane of the second hexagonal ferrite particles in the second radio wave absorbing surface.

3. The radio wave absorber of claim 1, wherein an amount of the first hexagonal ferrite particles included in the first radio wave absorber is 70 weight percent or more and 95 weight percent or less, and wherein an amount of the second hexagonal ferrite particles included in the second radio wave absorber is 70 weight percent or more and 95 weight percent or less.

4. The radio wave absorber of claim 1, wherein a c-plane is a hexagonal plane in the crystal structure of the first and second hexagonal ferrite particles, and wherein the first and second hexagonal ferrite particles grow their crystal structures in a direction parallel to the c-plane.

5. The radio wave absorber of claim 4, wherein the c-plane of the first hexagonal ferrite particles are randomly oriented.

6. The radio wave absorber of claim 5, wherein the c-plane of the second hexagonal ferrite particles are oriented in a particular direction.

7. The radio wave absorber of claim 4, wherein the second hexagonal ferrite particles are plate-shaped crystal particles.

8. The radio wave absorber of claim 2, wherein the first degree of orientation is between 0.28 and 0.4.

9. The radio wave absorber of claim 8, wherein the second degree of orientation is between 0.31 and 0.39.

10. The radio wave absorber of claim 2, wherein a proportion of an area of the single domain particles to a total area of the first hexagonal ferrite particles is between 78% and 93%.

11. The radio wave absorber of claim 10, wherein the first degree of orientation is between 0.28 and 0.4.

12. The radio wave absorber of claim 11, wherein the second degree of orientation is between 0.31 and 0.39.

13. The radio wave absorber of claim 3, wherein a first degree of orientation of the first hexagonal ferrite particles in the first radio wave absorbing surface is smaller than a second degree of orientation of the second hexagonal ferrite particles in the second radio wave absorbing surface, the first degree of orientation of the first hexagonal ferrite particles is a degree of convergence of the orientation of a normal to a c-plane of the first hexagonal ferrite particles in the first radio wave absorbing surface, and the second degree of orientation of the second hexagonal ferrite particles is a degree of convergence of the orientation of a normal to a c-plane of the second hexagonal ferrite particles in the second radio wave absorbing surface.

14. The radio wave absorber of claim 13, wherein the c-plane of the first hexagonal ferrite particles are randomly oriented.

15. The radio wave absorber of claim 14, wherein the c-plane of the second hexagonal ferrite particles are oriented in a particular direction.

16. The radio wave absorber of claim 15, wherein the second hexagonal ferrite particles are plate-shaped crystal particles.

17. The radio wave absorber of claim 13, wherein the first degree of orientation is between 0.28 and 0.4.

18. The radio wave absorber of claim 17, wherein the second degree of orientation is between 0.31 and 0.39.

19. The radio wave absorber of claim 18, wherein a proportion of an area of the single domain particles to a total area of the first hexagonal ferrite particles is between 78% and 93%.

* * * * *